United States Patent
Bedell et al.

(10) Patent No.: US 9,929,313 B2
(45) Date of Patent: *Mar. 27, 2018

(54) PROTECTIVE CAPPING LAYER FOR SPALLED GALLIUM NITRIDE

(71) Applicant: INTERNATIONAL BUSINESS MACHINES CORPORATION, Armonk, NY (US)

(72) Inventors: Stephen W. Bedell, Wappingers Falls, NY (US); Keith E. Fogel, Hopewell Junction, NY (US); Paul A. Lauro, Brewster, NY (US); Devendra K. Sadana, Pleasantville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/353,283

(22) Filed: Nov. 16, 2016

(65) Prior Publication Data

US 2017/0222090 A1 Aug. 3, 2017

Related U.S. Application Data

(63) Continuation of application No. 15/010,994, filed on Jan. 29, 2016, now Pat. No. 9,570,295.

(51) Int. Cl.
*H01L 21/28* (2006.01)
*H01L 21/3205* (2006.01)
(Continued)

(52) U.S. Cl.
CPC .......... *H01L 33/32* (2013.01); *H01L 33/0025* (2013.01); *H01L 33/0075* (2013.01);
(Continued)

(58) Field of Classification Search
CPC ................ H01L 21/02505; H01L 29/2003; H01L 24/27
(Continued)

(56) References Cited

U.S. PATENT DOCUMENTS 8,247,261 B2  8/2012  Bedell et al.
8,450,184 B2  5/2013  Bedell et al.
(Continued)

OTHER PUBLICATIONS

List of IBM Patents or Patent Applications Treated as Related dated Nov. 16, 2016, 2 pages.
(Continued)

*Primary Examiner* — S. V. Clark
(74) *Attorney, Agent, or Firm* — Tutunjian & Bitetto, P.C.; Vazken Alexanian

(57) ABSTRACT

Described herein is a method for manufacturing a stack of semiconductor materials in which a growth substrate is separated from the stack after a semiconductor material, e.g., a Group III nitride semiconductor material, is grown on the substrate. The separation is effected in a spalling procedure in which spalling-facilitating layers are deposited over a protective cap layer that is formed over the Group III-nitride semiconductor material. Such spalling-facilitating layers may include a handle layer, a stressor layer, and an optional adhesion layer. The protective cap layer protects the Group III-nitride from being damaged by the depositing of one or more of the spalling-facilitating layers. After spalling to remove the growth substrate, additional processing steps are taken to provide a semiconductor device that includes undamaged semiconductor material. In one arrangement, the semiconductor material is GaN and includes p-doped GaN region that was undamaged during manufacturing.

20 Claims, 7 Drawing Sheets

(51) Int. Cl.
  *H01L 33/32* (2010.01)
  *H01L 33/00* (2010.01)
  *H01L 33/06* (2010.01)
  *H01L 33/12* (2010.01)
  *H01L 33/36* (2010.01)
  *H01L 33/44* (2010.01)

(52) U.S. Cl.
  CPC .......... *H01L 33/0079* (2013.01); *H01L 33/06* (2013.01); *H01L 33/12* (2013.01); *H01L 33/36* (2013.01); *H01L 33/44* (2013.01); *H01L 2933/0016* (2013.01); *H01L 2933/0025* (2013.01)

(58) Field of Classification Search
  USPC ....... 438/458, 464, 465, 603, 604, 606, 761, 438/763; 257/103, 442, 613, 614, 615, 257/632
  See application file for complete search history.

(56) References Cited

U.S. PATENT DOCUMENTS

| | | | |
|---|---|---|---|
| 8,709,914 | B2 | 4/2014 | Bedell et al. |
| 8,748,296 | B2 | 6/2014 | Bedell et al. |
| 9,059,339 | B1* | 6/2015 | Bayram ............... H01L 33/0079 |
| 9,214,353 | B2 | 12/2015 | Yonehara et al. |
| 9,324,601 | B1 | 4/2016 | Allen et al. |
| 2012/0322244 | A1 | 12/2012 | Bedell |
| 2013/0193466 | A1 | 8/2013 | Sudhiranjan et al. |
| 2013/0269860 | A1 | 10/2013 | Khayyat |
| 2014/0326186 | A1 | 11/2014 | Paranjpe et al. |
| 2015/0069420 | A1* | 3/2015 | Paranjpe ............. H01L 33/0079 257/79 |
| 2015/0179428 | A1 | 6/2015 | Bayram et al. |
| 2016/0020284 | A1* | 1/2016 | D'Evelyn ........... H01L 29/2003 428/64.1 |

OTHER PUBLICATIONS

Lee et al., "Removal of dry etch damage in p-type GaN by wet etching of sacrificial oxide layer," Journal of Vacuum Science and Technology B, vol. 22, Nov. 2, 2004, pp. 479-482.
Li et al, "Plasma-induced damage in GaN-based light emitting diodes," Proc. of SPIE, vol. 6841, 2007, 68410X, Mar. 2008, 6 pages.
Lee et al., "Dry-etch damage and its recovery in InGaN/GaN multi-quantum-well light-emitting diodes," Semiconductor Science and Technology, vol. 18, Nov. 6, 2003, pp. 530-534.
Cao, "Advanced processing of GaN for novel electronic devices," PhD Dissertation, University of Florida, Oct. 2000, 204 pages.
K. S. Ramaiah et al., Characterization of InGaN/GaN multi-quantum well blue-light-emitting diodes grown by metal organic chemical vapor deposition, Applied Physics Letters, 84, 3307, Apr. 20, 2004.
Peng et al., Deep ultraviolet enhanced wet chemical etching of gallium nitride, Applied Physics Letters, vol. 72, No. 8, Feb. 23, 1998.
Yasuyuki Kobayashi et al. Thermal Stability of Low-Temperature GaN and AlN Buffer Layers During Metalorganic Vapor Phase Epitaxy Monitored by In Situ Shallow-Angle Reflectance Using Ultraviolet Light, Jpn. J. Appl. Phys. vol. 37 (1998) pp. L 1208-L 1210 Part 2, No. 10B, Oct. 15, 1998.
Hiroshi Amano, Growth of GaN on sapphire by low temperature deposited buffer layer and realization of p-type GaN by Mg-doping followed by LEEBI treatment, Graduate School of Engineering, Akasaki Research Center, Nagoya University, Dec. 10, 2014.

* cited by examiner

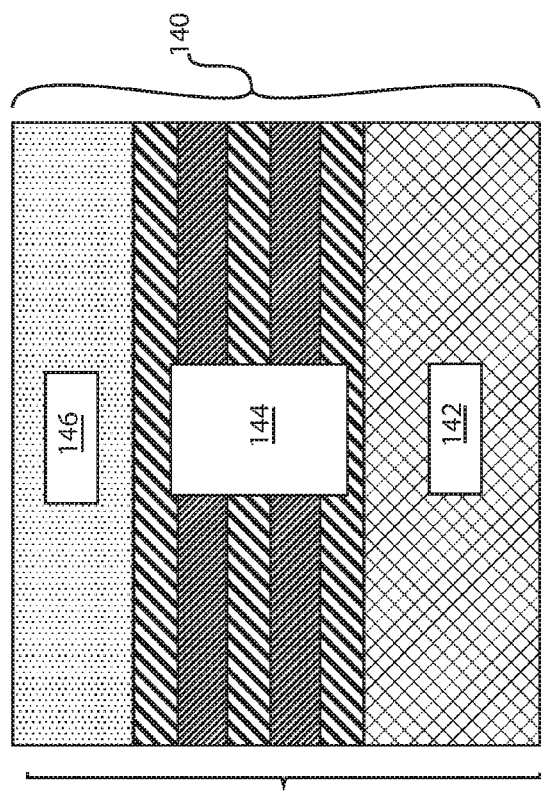
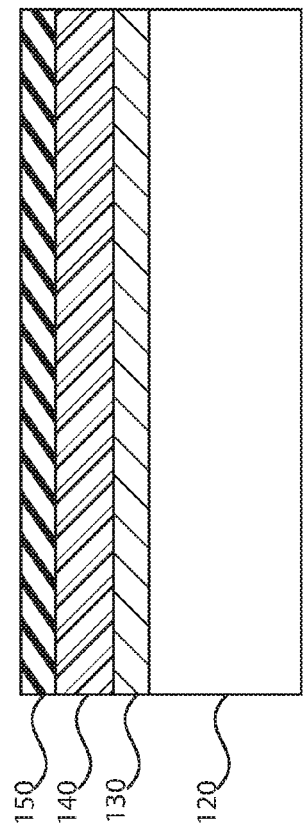
FIG. 3
FIG. 2

US 9,929,313 B2

PROTECTIVE CAPPING LAYER FOR SPALLED GALLIUM NITRIDE

BACKGROUND

Technical Field

The present invention relates to Group III nitride semiconductor devices that are prepared with spalling, and more particularly to GaN semiconductor devices provided with a protective cap layer that protects the Group III nitride semiconductor material during spalling and when preparing for spalling.

Description of the Related Art

Spalling may be employed to separate semiconductor materials from a substrate on which the semiconductor materials have been grown. With the mechanical forces involved in separating the materials by spalling, there are times when including a stressor layer among the stack of layers aids in separation by spalling. For example, some semiconductor materials exhibit relatively high fracture toughness and so it could be useful to include a stressor layer. Gallium nitride (GaN) is an example of a high-fracture toughness semiconductor material. Further, to assure good adhesion between the layers, an adhesion layer may also be included in the stack of layers prior to separation by spalling.

Sputtering may be employed in depositing an adhesion layer, such as a metal or metal-based adhesion layer. Sputtering may provide a metal or metal-based adhesion layer with stronger bonding properties when compared to other deposition methods, such as thermal evaporation. However, certain materials are not suited for receiving a sputter-deposited layer because the sputtering method can damage the deposit-receiving material. One such material is gallium nitride (GaN), and in particular, a GaN material that has been doped with a p-type dopant ("pGaN" or "p-doped GaN"). Exposure to the plasma during the initial stages of deposition may damage the surface of p-doped GaN, possibly to an extent that renders the p-doped GaN ineffective as a semiconductor material. For example, surface damage may render p-doped GaN non-conducting.

SUMMARY

In accordance with an embodiment of present principles, described is a method of producing a semiconductor device. A stack including a semiconductor material layer is formed in which a Group III nitride semiconductor material such as gallium nitride is formed on a growth substrate. A protective layer is formed over the Group III nitride semiconductor material, and spalling-facilitating layers are formed over the protective layer. The spalling-facilitating layers include a handle layer and a stressor layer formed over the protective layer. An optional adhesion layer may be formed between the stressor layer and the protective layer as another spalling-facilitating layer. The growth substrate is then separated from the semiconductor stack by applying a sufficient force to the handle. Electrical contacts are formed on a side of the group III nitride semiconductor material. A base substrate is formed on the electrical contacts, and the aforementioned spalling-facilitating layers are removed. The protective cap layer is removed, resulting in a semiconductor device that was not damaged by spalling and during the preparation for spalling.

In accordance with another embodiment of the present principles, described herein is a stack including semiconductor material that includes a growth substrate on which a Group III nitride semiconductor material is grown. A protective layer that forms a barrier is provided over the Group III nitride semiconductor material. An adhesion layer is formed over the protective layer by sputtering. The presence of the protective layer protects the Group III nitride semiconductor material from being damaged during the sputtering of the adhesion layer. A stressor layer is formed over an adhesion layer, and a handle layer is formed over the stressor layer. The stack of materials can be subjected to spalling and further processing to provide a semiconductor device in which the semiconductor material has not been damaged during spalling and during the preparation for spalling.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein:

FIG. 2 is a cross sectional view of a semiconductor device in accordance with an embodiment of the present principles at an early stage of device fabrication showing a stack of layers including a protective cap layer formed over the semiconductor material layer;

FIG. 3 is an enhanced cross sectional view of a Group III nitride region of FIG. 2 in accordance with an embodiment of the present principles showing a p-type region, a MQW region, and an n-type region;

DETAILED DESCRIPTION

Figure 1:
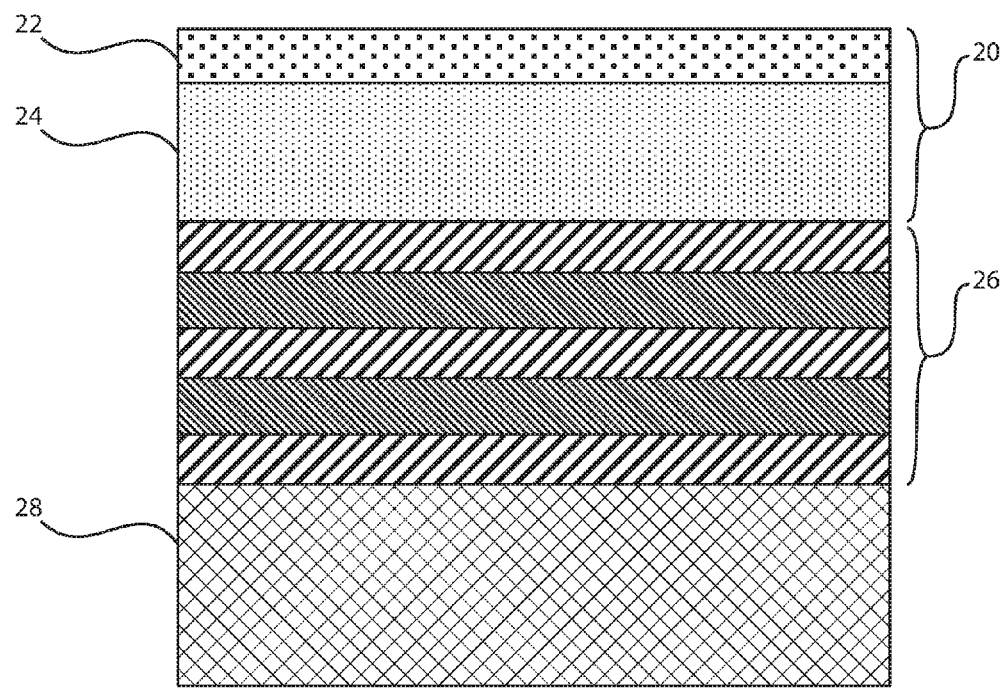
FIG. 1 depicts a cross-sectional view of what is observed in a transmission electron microscopy (TEM) image of a GaN semiconductor device that has been damaged in the preparation for spalling.

A semiconductor material is grown on a substrate, e.g., a growth template. In one embodiment, the semiconductor material is a Group III nitride material, e.g., of the kind that is found in an optoelectronic semiconductor device, such as a light-emitting diode (LED). In another embodiment, the semiconductor material is a GaN material. In one embodiment, the GaN semiconductor material is grown, from bottom (e.g., substrate) up, with an n-doped region, a multiple quantum well (MQW) region, and a p-doped region.

A p-type dopant, e.g., Mg, can be introduced in the GaN material and the doped semiconductor material can be grown in-situ. After growth of the Mg-doped GaN, the semiconductor material is not activated, possibly due to the presence of hydrogen in the GaN during growth, as hydrogen may deactivate Mg as a dopant. An annealing may be conducted in a nitrogen atmosphere to activate the Mg dopant in the GaN material.

As the structure according to present principles is formed, spalling may be employed to separate the substrate from semiconductor structure. When spalling is used, it is advantageous to provide for a strong adhesive bond to the GaN surface, for example, on the p-doped side of the GaN structure. A titanium (Ti) film providing strong adhesive properties can be deposited on the p-doped GaN structure by sputtering.

A p-doped GaN material could be damaged when an adhesion layer, for example a Ti adhesion layer, is deposited on the p-doped GaN surface by sputtering. In some instances, the damage may extensive enough to render the p-doped GaN material ineffective as a semiconductor (e.g., the p-doped GaN material is rendered non-conductive).

In accordance with an embodiment of the present principles, and in order to avoid the possible damage that sputtering could impart to the p-doped GaN surface, a protective cap layer is applied over the p-doped GaN layer prior to spalling. The protective cap layer adheres well to the underlying p-doped GaN layer, does not deactivate the p-doped GaN, and may be removed selectively after spalling to provide an undamaged, activated pGaN surface.

It is to be understood that the present invention will be described in terms of a given illustrative structure or architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It is also to be understood that the present invention will be described in terms of a particular tandem (multi-junction) structure; however, other architectures, structures, substrate materials and process features and steps may be varied within the scope of the present invention. The tandem structure includes cells, which will be described in terms of a particular material. Each cell includes a p-doped layer, an n-doped layer and perhaps an undoped intrinsic layer. For the present description, the n-doped layer and p-doped layers will be formed either from a same base material that is doped to provide an n-type portion and a p-doped portion or from two different base materials so that a first material is doped to provide the n-type portion and the second material is doped to provide the p-doped portion. For simplicity, each cell layer will be described in terms of the base layer material. The n-doped and p-doped regions are preferably formed by doping during epitaxial growth. Other doping methods may also be employed. While intrinsic layers may be formed between the n-type and p-doped layers, e.g., very thin intrinsic layers inserted intentionally between an emitter and a base to mitigate intermixing of the dopants at a junction, the intrinsic layers, if needed, are not depicted in the drawings for simplicity.

It is also to be understood that the present invention will be described in terms of a given illustrative architecture having a particular tandem (multijunction) structure; however, other architectures, structures, substrate materials and process features and steps may be varied within the scope of the present invention. The tandem structure includes cells, which will be described in terms of a particular material. While each cell includes a p-doped layer, an n-doped layer and perhaps an undoped intrinsic layer, the n-doped layer and p-doped layers will be omitted from the FIGS. and the description for ease of explanation. Instead, for simplicity, each cell layer will be described in terms of a base layer material and a band gap associated with the base layer. The n-doped and p-doped regions may be formed by doping during epitaxial growth or doped after formation by any known implantation or diffusion process.

Reference in the specification to "one embodiment" "one other embodiment" "another embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Reference now turns to the drawings in which like numerals represent the same or similar elements. FIG. 1 depicts what is observed in a TEM image of a Group III nitride structure, e.g., a gallium nitride semiconductor structure that has been subjected to sputtering in an argon (Ar) atmosphere. The semiconductor structure, from the bottom up (e.g., substrate up), includes an n-doped gallium nitride region (nGaN) 26, a multiple quantum well region 28 comprised of periods of indium-doped gallium nitride (In—GaN) and undoped gallium nitride (GaN), and a p-doped gallium nitride region (pGaN) 20. Surface-exposed region 22 of the p-doped region 20 has been damage by a sputtering process, e.g., sputtering the surface of the p-doped GaN with a titanium (Ti) layer deposited from a Ti target that has been bombarded with an argon (Ar) gas carrier. It possibly may be that the energy of the Ar gas is responsible for damaging the delicate surface of the p-type doped GaN material. The damage appears to be a surface phenomenon, as under region 24 has not been damaged by the sputtering process. The thickness of the damaged surface-exposed region 22 is about 15 nm.

Referring now to FIG. 2, there is illustrated according to present principles a semiconductor device according to present principles at an early stage of formation in which a semiconductor material has been grown and provided with a protective cap layer. Shown is a multilayered stack of, from bottom to top, a substrate 120, a buffer layer 130, a Group III nitride material layer 140, and a protective cap layer 150. Buffer layer 130 is an optional layer that may be included to improve the lattice match between the Group III nitride layer 140 and the substrate 120.

The substrate 120 provides a growth template on which the Group III nitride semiconductor material is grown, and includes materials that support the growth of a Group III nitride material by methods such as metalorganic chemical vapor deposition (MOCVD) and molecular beam epitaxy (MBE). The substrate 120 may also be referred to herein as a growth template. In one embodiment, the substrate 120 can comprise a single material having unitary construction. In another embodiment, the substrate 120 may comprise two or more different materials formed in a stack. Suitable substrate materials include aluminum oxide ($Al_2O_3$), sapphire, e.g., a patterned sapphire substrate (PSS), a Group III nitride material, e.g., gallium nitride (GaN), silicon carbide (SiC) and zinc oxide (ZnO). A multilayered stack of one or more of these materials may be employed. When the substrate is formed of certain materials, e.g., GaN, the optional buffer layer 130 can be omitted, with growth of the Group III nitride layer 140 occurring directly on the substrate layer 120.

The term "Group III nitride" refers to a compound of nitrogen and at least one element from Group III of the Periodic Table of Elements, e.g., aluminum (Al), gallium (Ga) and indium (In). Illustrative examples of some Group III nitride materials that can be employed as substrate 120 include, but are not limited to, GaN, AlN, AlGaN, GaAlN, and GaAlInN.

The substrate 120 may have a thickness from about 100 to about 3000 micrometers. Thicknesses that are greater than or lesser than the aforementioned thickness range can also be used for the substrate 120.

Next, an optional buffer layer 130 can be formed on a surface of the substrate 120. The buffer layer 130 covers the surface of substrate 120. In some embodiments, the buffer layer 130 does not have to be formed, e.g., it can be omitted from the stack. For example, if the substrate is formed of gallium nitride, then it is not necessary to include the buffer layer 130.

The buffer layer 130 can be formed from any Group III nitride material. The material used to form the buffer layer 130 may depend on the substrate material that has been used. By way of example, when the substrate 120 includes either sapphire or SiC, the buffer layer 130 can be comprised of AlN, GaN, or AlGaN. In one other embodiment, the buffer layer 130 is formed a material such as low temperature AlN or low temperature GaN. As indicated above, if the substrate 120 is comprised of GaN, no buffer layer 130 need be included when GaN is used to form the semiconductor material 140. The inclusion of the buffer layer 130 may in certain instances be beneficial in that it provides a two-dimensional (2-D) flat planar growth on the substrate surface.

Buffer layer 130 may be formed by introducing an organo-Group III element containing precursor such as, for example, an organoaluminum precursor (e.g., a trialkylaluminum compound, e.g., triethylaluminum) or an organogallium precursor (e.g., a trialkylgallium compound, e.g., triethylgallium) or a mixture thereof, and a nitride precursor such as, for example, ammonium ($NH_3$) into the reactor chamber of the a deposition apparatus, e.g., a MOCVD apparatus, or an metalorganic vapor phase epitaxy (MOVPE) apparatus. MOCVD may be carried out with or without a plasma enhancement. An inert carrier gas may be present with one of the precursors used in forming the buffer layer 130, or an inert carrier gas can be present with both the precursors used in forming the buffer layer 130. An exemplary carrier gas may be hydrogen gas. The substrate 120 may be subjected to a nitriding step prior to forming the buffer layer, e.g., exposing the substrate 120 to a nitriding gas (e.g., ammonia ($NH_3$)) for a period of time, e.g., about 5 minutes. The buffer layer 130 may be formed at a temperature of about 500° C. or greater. In one embodiment, the deposition of the buffer layer 130 occurs at a temperature from about 650° C. to about 850° C. In another embodiment, the deposition of the buffer layer 130 occurs at a temperature from about 850° C. to about 1050° C. The deposition of the buffer layer 130 is performed for a time period of about 1 minute to about 20 minutes. The buffer layer 130 that is formed may have a thickness from about 5 to about 500 nm. Molecular beam epitaxy (MBE) may also be used to form the buffer layer 130.

Next, the Group III nitride material layer 140 is formed. The Group III nitride material includes a compound of nitrogen and at least one element from Group III of the Periodic Table of Elements, e.g., aluminum (Al), gallium (Ga) and indium (In). In one embodiment, the Group III nitride material that is formed is a gallium nitride material such as gallium nitride (GaN), GaAlN, GaInN, and GaAlInN. In another embodiment, the Group III nitride material that is formed is an aluminum nitride material such as aluminum nitride (AlN), AlGaN, AlInN, and AlGaInN. In one embodiment, the Group III nitride material is GaN.

The formation of the Group III nitride material layer 140 includes introducing at least one organo-Group III element containing precursor and a nitride precursor such as, for example, ammonium nitride, into the reactor chamber of the MOCVD apparatus or an MBE apparatus. Examples of organogallium precursors that can be employed include trialkylgallium compounds such as, for example, trimethylgallium and triethylgallium. Examples of organoaluminum precursors that can be employed include trialkylaluminum compounds such as, for example, trimethylaluminum and triethylaluminum. Similar precursors can be used for other types of Group III nitrides.

An inert carrier gas may be present with one of the precursors used in forming the Group III nitride material layer 140, or an inert carrier gas can be present with both the precursors used in forming the Group III nitride material layer 140.

The deposition of the Group III nitride material layer 140 may be performed at a temperature of about 750° C. or greater. In one embodiment, the deposition of the Group III nitride material layer 140 occurs at a temperature from about 900° C. to about 1200° C. In another embodiment, the deposition of the Group III nitride material layer 140 occurs at a temperature from about 1200° C. to about 1400° C. The deposition of the Group III nitride material layer 140 may be performed for a time period of about 1 minute to about 2 hours.

Referring to FIG. 3, in one embodiment the Group III nitride layer 140 includes an n-doped region 142, a multiple quantum well (MQW) region 144, and a p-doped region 146. The n-doped region 142 may contain an n-type dopant, e.g., silicon (Si). The p-doped region 146 may contain a p-type dopant, e.g., magnesium (Mg). In one embodiment, the n-doped region is nGaN and the p-doped region is pGaN. In one embodiment, the individual wells of multiple quantum well region 144 may comprise InGaN of about 3 nm thick and undoped GaN wells of about 7 nm thick. In one embodiment, the Group III nitride layer 140 includes an n-doped region 142 comprising nGaN, a multiple quantum well (MQW) region 144 comprising individual wells of indium gallium nitride (InGaN) and undoped GaN, and a p-doped region 146 comprising pGaN. The InGaN/GaN multiple quantum wells are active layers in a light-emitting diode (LED). The emission spectrum can be tailored from the ultraviolet region to the visible region by varying the amount of indium (In) used the wells of the MQW.

In one embodiment, the n-doped GaN region, the MQW region, and the p-doped GaN region may be prepared on a buffer layer 130 formed over a sapphire substrate 120 by MOCVD. A buffer layer with thickness of 25 nm may be grown at a temperature of about 560° C. A Si-doped GaN (e.g., n-doped GaN) layer about 2 µm thick may be grown at a temperature of about 1060° C., on which wells of 3 nm InGaN and 7 nm undoped GaN barrier (B) may be grown at a temperature of about 780° C. using $N_2$ as a carrier gas. This structure may be capped with a growth of p-doped (e.g., Mg-doped) GaN layer having a thickness of about 0.5 µm. Trimethylgallium, trimethylindium, and $NH_3$ can be used as precursors for Ga, In, and radical nitrogen, respectively. $N_2$ and $H_2$ may be used as carrier gases in the growing of the Group III nitride semiconductor material 140.

For a p-type dopant, Mg can be introduced to the GaN material and the doped semiconductor material can be grown in-situ. After growth of the Mg-doped GaN, the semiconductor material is not activated, possibly due to the presence of hydrogen in the GaN during growth, for the reason that hydrogen may deactivate Mg. After growth, annealing is conducted in a nitrogen atmosphere to drive out hydrogen, and thereby activating the Mg in the p-doped GaN material. The nitrogen anneal is performed at a temperature of about 750° C.

Referring back to FIG. 2, protective cap 150 is formed on the Group III-nitride layer to protect the upper p-doped Group III nitride layer (e.g. p-doped GaN layer). Protective cap layer may be formed in-situ or ex-situ. In situ protective cap forming materials may be, for example, one or both of aluminum nitride (AlN) and thin layer of n-type GaN. Ex situ protective cap forming materials may be, for example, one or both of silicon nitride ($S_3N_4$) and aluminum oxide ($Al_2O_3$). In the case of in-situ capping, after growth of the p-doped GaN layer, a layer of AlN may be formed using metal-organic chemical vapor deposition (MOCVD) or molecular beam chemical vapor deposition (MBCVD). In the case of MOCVD the precursors may be $NH_3$ and trimethyl aluminum (TMA). In one embodiment, the AlN layer may be about <100 nm thick. In another embodiment, a low temperature (<700° C.) AlN protective capping layer 140 is grown, having a thickness of about 50 nm.

In another embodiment, undoped GaN can be grown as an in-situ capping layer. In one embodiment, the GaN capping layer is grown at temperature about 500° C. to about 700° C. The GaN capping layer may have a low quality crystalline structure, and may even have a polycrystalline structure.

In another embodiment, protective cap layer 150 may be formed ex-situ. For example, any method in which a protective cap layer is formed by depositing a film of protective material after the initial device structure is grown may be employed. Exemplary ex situ formation methods include physical vapor deposition techniques (PVD) such as sputtering or evaporation. In the case of sputtering deposition, to minimize damage to the p-doped GaN layer, a sputtering gas having an atomic weight less than argon (Ar) may be employed. Such gases may include neon (Ne), $N_2$, $O_2$, helium (He). Where DC sputtering is employed, power may be kept to less than 2 kW. Any evaporation technique e.g., thermal or e-beam may appropriate. Ex-situ capping also includes a second MOCVD or MBCVD step of promoting aluminum oxide and silicon nitride growth.

The p-doped GaN material is susceptible to damage, as indicated above. Damage to the crystalline structure could deactivate the p-typed dopant (e.g., Mg) which would render the GaN semiconductor material electrically insulating. Therefore, when adding the metallic adhesive layer from a Ti target using an Ar carrier gas, interactions between the relatively high energy Ar atoms and the surface of the p-doped GaN may possibly deactivate the Mg dopant material and negate the conductive properties of the p-doped GaN material.

When spalling is subsequently used to separate substrate 120 from the rest of the structure, it may be advantageous to beforehand provide for strong interlayer bonding by depositing an adhesion layer material. The drawback of forming the adhesion layer on the GaN surface, for example, on the p-doped side of the GaN structure, is that an adhesion layer such a Ti film, if formed by sputtering, possibly may damage the p-doped GaN structure. To avoid the possible damage that sputtering a material such as Ti may cause to the p-doped GaN, and in accordance with an embodiment of the present principles, a protective cap layer 150 is formed over the p-doped GaN layer. The protective cap layer 150 adheres well the underlying pGaN, does not deactivate the p-doped GaN, and can be removed selectively after spalling to leave an undamaged, activated pGaN surface as part of the semiconductor structure.

Figure 4:
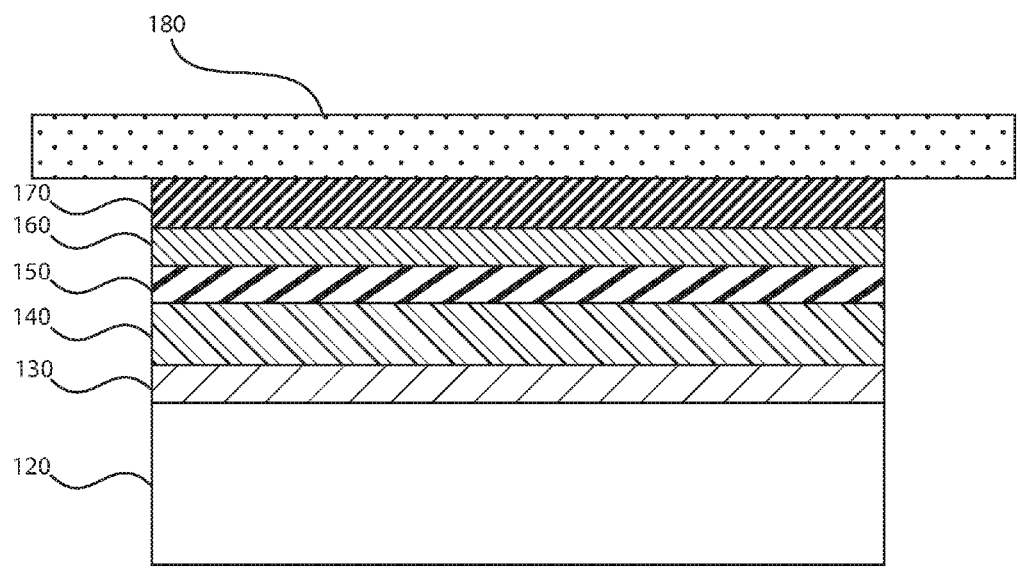
FIG. 4 is a cross sectional view of a semiconductor device in accordance with an embodiment of the present principles at another stage of device fabrication in which a handle layer, a stressor layer, and an adhesive layer are added to the stack of layers by forming same over the protective cap layer.

Referring to FIG. 4, the adhesion layer 160 is formed atop the protective cap layer 150. A stressor layer 170 is formed atop the adhesive layer. A handle layer 180 is formed atop the seed stressor layer 170. The structure below the protective cap layer 150 is as shown in FIG. 2 and described above.

The adhesion layer 160 may be employed when the stressor layer 170 has poor adhesion to the material of the protective cap layer 150. In one embodiment, the adhesion layer 160 is a metal-containing layer. In one embodiment, any metal adhesion material can be used in the adhesion layer 160. Exemplary metals include but are not limited to titanium (Ti), titanium/tungsten alloy (Ti/W), chromium (Cr), nickel (Ni) and any combination thereof. In one embodiment, the metal of the adhesion layer 160 is Ti. The adhesion layer 160 may comprise a single layer or it may include a multilayered structure comprising at least two layers of different metal adhesion materials.

The metal-containing adhesion layer 160 can be formed utilizing deposition techniques such as sputtering, chemical vapor deposition, plasma enhanced chemical vapor deposition, chemical solution deposition, physical vapor deposition, and plating. In one embodiment, the adhesion layer 160 is deposited atop the protective cap layer 150 by a sputtering process in which a Ti target is bombarded by a sputter-inducing stream of argon gas. In one embodiment, an optional sputter clean process may be employed before sputter deposition occurs. As explained above, the deposition of an adhesion layer comprised of Ti by sputtering has certain benefits when applied to the protective cap layer, as it provides a strong adhesion layer that is conducive to spalling.

The adhesion layer 160 may have a thickness of from about 5 nm to about 200 nm. In one embodiment, the thickness of the adhesion layer is from about 100 nm to about 150 nm. Other thicknesses for the adhesion layer 160 that are below and/or above the aforementioned thickness ranges may also be employed.

In accordance with an embodiment of the present principles, the stressor layer 170 that is formed atop upper surface of the adhesion layer 160 (or atop the protective cap layer 150 when adhesion layer 160 is not formed) has a thickness and stress value that cause spalling mode fracture to occur within the substrate 120. By "spalling mode fracture", it is meant that a crack is formed within substrate 120 and the combination of loading forces maintain a crack trajectory at a depth below the stressor/substrate interface. For a given stressor material and substrate material combination, a thickness value and a stressor value for the stressor layer is chosen that makes spalling mode fracture possible. For example the combination produces a $K_I$ value greater than the $K_{IC}$ of the substrate 120.

Specifically, the thickness of the stressor layer 170 is chosen to provide the desired fracture depth within the substrate 120. For example, if the stressor layer 170 is Ni, then fracture will occur at a depth below the stressor layer 170 roughly 2 to 3 times the Ni thickness. The stress value for the stressor layer 170 is then chosen to satisfy the condition for spalling mode fracture. This can be estimated by the equation:

$$t^* = \{2.5 \times 10^6 (K_{IC}^{3/2})\} \sigma^2$$

where t* is the critical stressor layer thickness (in microns), $K_{IC}$ is the fracture toughness of the substrate 120 (in units of $MPa \cdot m^{1/2}$) and σ is the stress value of the stressor layer (in MPa or megapascals). In another aspect, the thickness may be anywhere from about 5 um to about 50 um, and the stress value of the stressor layer is in the range of about 250 to about 850 megapascals (MPa). The above expression is intended to be a guide. Spalling may occur at stress or thickness values up to about 20% to about 0% less than that predicted by the above expression. In the case where substrate 120 has a significantly higher $K_{IC}$ than the Group III-nitride semiconductor layer 140 (e.g., sapphire or SiC growth templates), spalling tends to occur at the interface between substrate 120 and buffer layer 130 and the appropriate $K_{IC}$ value for the above expression is that of the Group III-nitride semiconductor layer 140.

In accordance with an embodiment of the present principles, the stressor layer 170 is under tensile stress while present on the substrate 120 at the spalling temperature. Illustrative examples of materials that can be employed as the stressor layer 170 include, but are not limited to, a metal, a polymer, such as a spall inducing tape layer, or any combination thereof. The stressor layer 170 may comprise a single stressor layer, or a multilayered stressor structure including at least two layers of different stressor material can be employed.

In one embodiment, the stressor layer 170 is a metal material. In another embodiment, the stressor layer 170 is a polymer material. In yet another embodiment, the stressor layer 170 is composed of a spall inducing tape. In another embodiment, for example, the stressor layer 170 may comprise a two-part stressor layer including a lower part and an upper part. The upper part of the two-part stressor layer can be comprised of a spall inducing tape layer. When a metal is employed as the stressor layer 16, the metal can include, for example, nickel (Ni), titanium (Ti), chromium (Cr), molybdenum (Mo), iron (Fe), tungsten (W) and alloys thereof. In one embodiment, the stressor layer 170 includes at least one layer of Ni.

As indicated, a polymeric material may be used as the stressor layer 170. Illustrative examples of polymers that can be employed as the stressor layer 170 include, but are not limited to, polyimides, polyesters, polyolefins, polyacrylates, poly(meth)acrylates, polyurethane, polyvinyl acetate, and polyvinyl chloride.

When a spall inducing tape layer is employed as the stressor layer 170, the spall inducing tape layer includes any pressure sensitive tape that is flexible, soft, and stress free at the temperature used to form the tape, yet strong, ductile and tensile at the temperature used during spalling. "Pressure sensitive tape" includes but is not limited to adhesive tapes that will stick with application of pressure and without the need for solvent, heat, or water for activation. Tensile stress in the tape at the spalling temperature is primarily due to thermal expansion mismatch between the substrate 120 (with a lower thermal coefficient of expansion) and the tape (with a higher thermal expansion coefficient).

The pressure sensitive tape that may be employed as stressor layer 170 includes at least an adhesive layer and a base layer. Materials for the adhesive layer and the base layer of the pressure sensitive tape include polymeric materials such as, for example, acrylics, polyesters, olefins, and vinyls, with or without suitable plasticizers. Plasticizers are additives that can increase the plasticity of the polymeric material to which they are added.

In one embodiment, the stressor layer 170 may be formed at a temperature which is at room temperature (about 15° C. to about 40° C.). In another embodiment, when a tape layer is employed, the tape layer can be formed at a temperature which is from about 15° C. to about 60° C.

When the stressor layer 170 is comprised of a metal or polymer, the stressor layer 170 can be formed utilizing deposition techniques such as, for example, dip coating, spin-coating, brush coating, sputtering, chemical vapor deposition, plasma enhanced chemical vapor deposition, chemical solution deposition, physical vapor deposition, and plating.

When the stressor layer 170 is comprised of a spall-inducing tape layer, the tape layer can be applied by hand or by mechanical means to the structure. The spall inducing tape can be formed utilizing techniques well known in the art or the tape can be commercially purchased from any well-known adhesive tape manufacturer. Some examples of spall inducing tapes that can be used as the stressor layer include, for example, Nitto Denko 3193MS™ thermal release tape, Kapton KPT-1™, and Diversified Biotech's CLEAR-170™ (acrylic adhesive, vinyl base)

In one embodiment, a two-part stressor layer can be formed on atop the substrate 120, wherein a lower part of the two-part stressor layer is formed at a first temperature which is at room temperature or above (e.g., about 15° C. to about 60° C.), in which an upper part of the two-part stressor layer comprises a spall-inducing tape layer formed at an auxiliary temperature which is at room temperature. If the stressor layer 170 is a metal material, it may have a thickness of from about 3 µm to about 100 µm, and in another embodiment, it may have a thickness of from about 4 µm to about 40 µm. Other thicknesses for a metallic stressor layer that are below and/or above the aforementioned thickness ranges can also be employed.

The handle layer 180 may initiate and propagate a spalling process in a manner that differs from the stressor layer 170. This may provide improved fracture control and versatility in handling the Group III nitride layer 140 when it is exfoliated from the substrate 120. The handle layer 180 formed atop the stressor layer 170 may comprise a flexible material which has a minimum radius of curvature of less than 30 cm. Illustrative examples of flexible materials that can be employed as the handle layer 180 include a metal foil or a polyimide foil. Other examples of flexible materials that can be employed as the handle layer 180 include polymers, tapes and spin-on materials.

The handle layer 180 may provide better fracture control and more versatility in handling the spalled portion of the substrate 120. The handle layer 180 may be used to guide the crack propagation during the spalling process. In one embodiment, handle layer 180 may be formed at room temperature, e.g., about 15° C. to about 40° C.

The handle layer 180 can be formed utilizing deposition techniques that are well known to those skilled in the art including, for example, dip coating, spin-coating, brush coating, sputtering, chemical vapor deposition, plasma enhanced chemical vapor deposition, chemical solution deposition, physical vapor deposition, and plating. The handle layer 180 may have a thickness of from about 1 µm to about few mm. In one embodiment, the handle may have a thickness of from about 20 µm to about 120 µm. Other thicknesses for the handle layer 180 that are below and/or above the aforementioned thickness ranges can also be employed.

Figure 5:
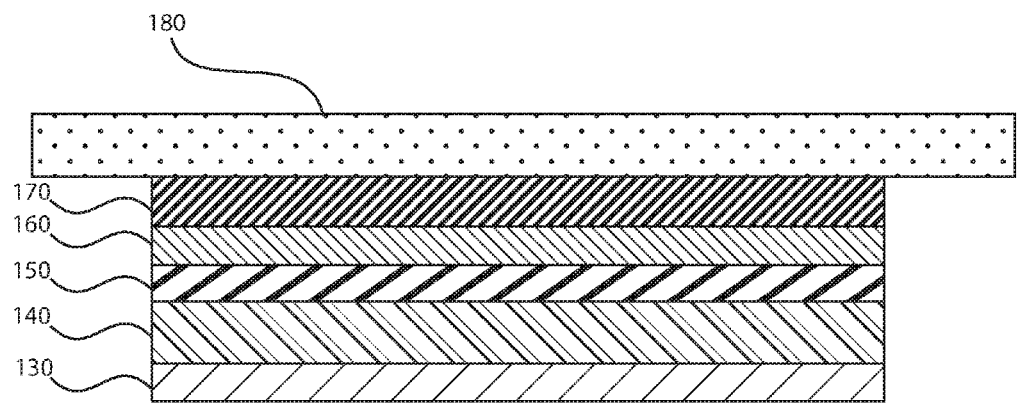
FIG. 5 is a cross sectional view of a semiconductor device in accordance with an embodiment of the present principles at a post-spalling stage of device fabrication in which a substrate layer is removed by spalling from the stack of layers.

FIG. 5 depicts the device after spalling has occurred. In the spalling operation, substrate 120 is removed. What remains, from top to bottom, is handle layer 180, stressor layer 170, adhesion layer 160, protective cap layer 150, Group III nitride layer 140, and buffer layer 130. Where the $K_{IC}$ of substrate 120 is equal to, or lower than, that of the Group III-nitride/MQW region 140, a portion of substrate 120 may remain after spalling. This may be the case if substrate 120 was GaN, ZnO or silicon. If the substrate 120 is GaN then removal may not be necessary. For other substrate types (e.g. ZnO or Si) wet chemical etching or reactive ion etching can be employed to remove the residual portion of the substrate 120.

The spalling process can be initiated at room temperature or higher or at a temperature that is less than room temperature. In one embodiment, spalling is performed at room temperature or higher (e.g., about 15° C. to about 40° C.). In another embodiment, spalling is performed at a temperature less than about 20° C. In a further embodiment, spalling occurs at a temperature of 77 K or less. In an even further embodiment, spalling occurs at a temperature of less than 206 K. In still yet another embodiment, spalling occurs at a temperature from 175 K to 130 K.

When a temperature that is less than room temperature is used, spalling process can be achieved by cooling the structure by a cooling process, including, for example, placing the structure in a liquid nitrogen bath, a liquid helium bath, an ice bath, a dry ice bath, a supercritical fluid bath, or any cryogenic liquid or gas. The spalled structure bay be warmed to ambient temperature, e.g., room temperature, by allowing the spalled structure to slowly warm by placing the structure in the ambient, e.g., room temperature environment. Alternatively, the spalled structure can be warmed to ambient temperature by heating same by using any suitable heating means.

Figure 6:
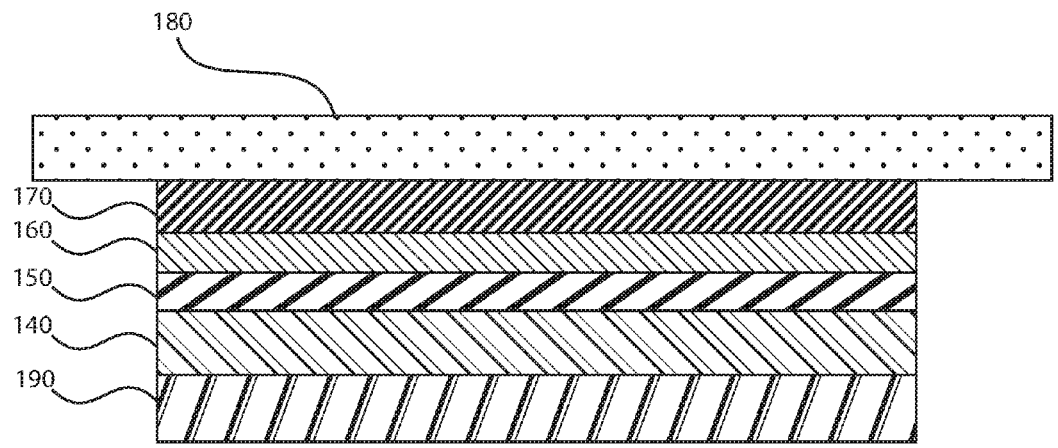
FIG. 6 is a cross sectional view of a semiconductor device in accordance with an embodiment of the present principles at another stage of device fabrication in which a buffer layer is removed from the stack of layers and an electrical contact layer is formed on the stack of layers.

Referring to FIG. 6, the optional buffer layer 130, if formed, is now removed. In one embodiment, the buffer layer is removed by etching. In one embodiment, the non-conductive buffer layer 130 is removed with an etching solution of sufficient etching strength. In one embodiment, the etching solution may be one or more of potassium hydroxide (KOH), tetramethylammonium hydroxide (TMAH) and potassium hydroxide ($H_3PO_4$). In one embodiment, reactive ion etching (RIE) is employed to remove the buffer layer 130. With RIE, the buffer surface 130 to be etched is placed on a RF powered electrode. During RIE the buffer surface 130 being etched takes on a potential that accelerates the etching species extracted from a plasma toward the surface, in which the chemical etching reaction is occurs in the direction normal to the surface.

Further referring to FIG. 6, electrical contact layer 190 is formed at the bottom of the stack, with, for example, the Group III nitride layer operatively connected to the electrical contact layer. The bonding metallurgy is usually a metal stack of Ti/Al/Ni/Au deposited on the Group III nitride layer 140 which serves as both the ohmic contact to nGaN (Ti) and as a solderable surface (Au) for the subsequent bonding step. The soldering material, which is used to attach the spalled layers to the bonding substrate 200, for example may be one containing one or more of In, Sn, Ag, and Au, alone or in combination.

Figure 7:
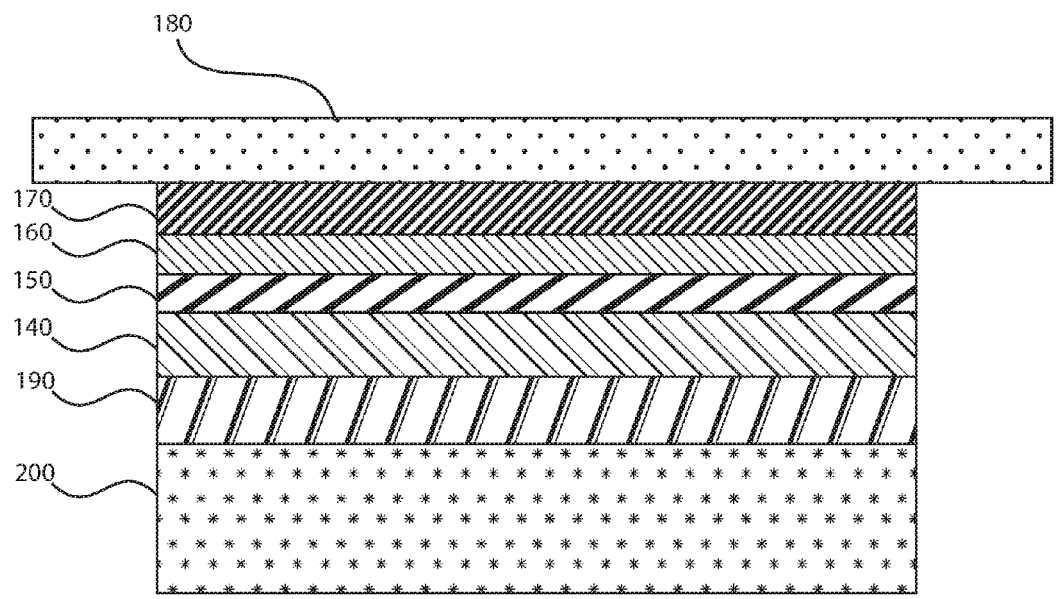
FIG. 7 is a cross sectional view of a semiconductor device in accordance with an embodiment of the present principles at another stage of device fabrication in which a bonding substrate is formed on the stack of layers.

Referring to FIG. 7, a bonding substrate 200 is formed at the bottom of the stack, with for example, the ohmic contact layer 190 being positioned atop the bonding substrate 200. The bonding substrate provides an underlayer for the remaining spalled layers, including semiconductor layer 140. In one embodiment, the bonding substrate is a high thermal conductivity material for effective heat dissipation under operating conditions. In one other embodiment, the bonding substrate 200 is a metal material, for example, Ni, Al, and Cu. In another embodiment, the bonding substrate is comprised of silicon. Other materials may be used as the bonding substrate, for example ceramics. In one embodiment, nickel is employed as the bonding substrate 200, for its high thermal conductivity, cost, and preferable thermal expansion coefficient.

Figure 8:
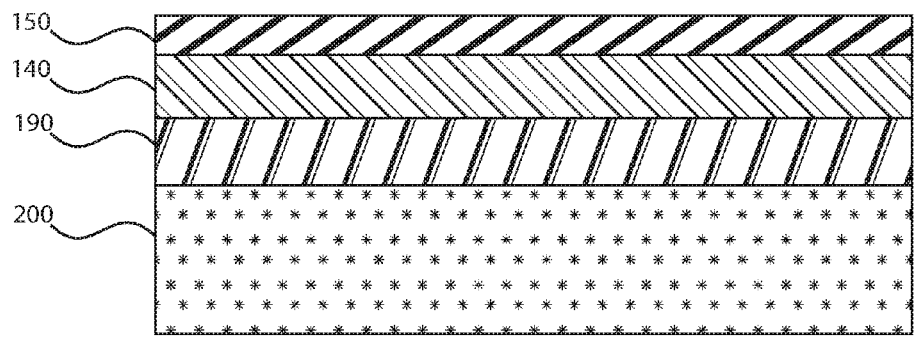
FIG. 8 is a cross sectional view of a semiconductor device in accordance with an embodiment of the present principles at another stage of device fabrication in which the handle layer, the stressor layer, and the adhesive layer are removed from the stack of layers.

Referring to FIG. 8, the handle layer 180, the stressor layer 170, and the (optional) adhesion layer 160 are removed from the spalled portion of the remaining stack. With the removal of these layers, the protective cap layer 150 becomes the top layer of the stack. Removal of the handle layer 180, the stressor layer 170, and the (optional) adhesion layer 160 can be effected by an etch process, using for example, and etching solution that includes aqua regia (e.g., $HNO_3/HCl$). In another example, UV or heat treatment is used to remove the handle layer 180, followed by a chemical etch to remove the stressor layer 170, followed by a different chemical etch to remove the adhesion layer 160.

Figure 9:
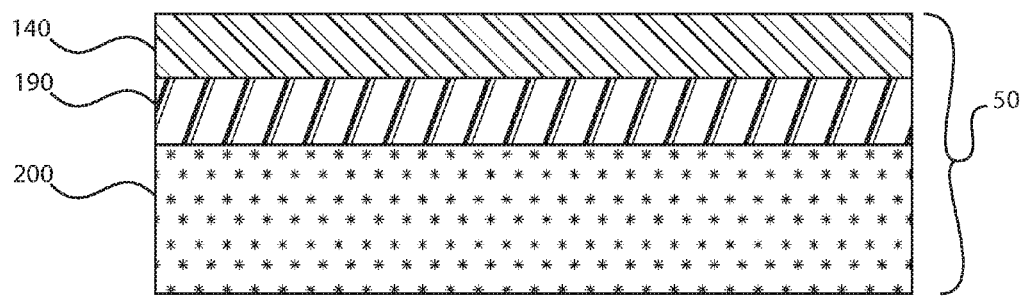
FIG. 9 is a cross sectional view of a semiconductor device in accordance with an embodiment of the present principles at later stage of device fabrication in which the protective cap layer is removed from the stack of layers.

FIG. 9 shows the semiconductor device 50 in a form in which the protective cap layer 150 is removed from the stack. What remains is the Group III nitride layer 140, the ohmic contact layer 190, and bonding substrate 200. Removal of the protective cap layer 150 occurs in a manner that does not damage the underlying Group III nitride layer 140. In one embodiment, the protective cap layer is removed by employing a chemical etchant such as one or more of hot phosphoric acid ($H_3PO_4$), potassium hydroxide (KOH) and tetramethylammonium hydroxide (TMAH). For example, hot etching may take place at a temperature of about 150° C. In yet another example of protective cap removal, photo-assisted chemical etching may be employed. In another embodiment, the layers can be removed in a process that combines reactive ion etching (RIE) and/or plasma based etching and a chemical etching process.

With the understanding that the protective cap layer 150 will be removed after spalling, in one embodiment it may be preferable to have formed the protective cap layer 150 from AlN. The reason for this is that AlN adheres very well to p-doped GaN during the growth process, and it can be grown at a relatively low temperature (e.g., <700° C.) that effectively limits, if not eliminates, the hydrogen passivation of p-doped GaN regions (e.g., Mg-doped GaN regions). Still further, AlN can be removed with a selective etching with a hot phosphoric acid ($H_3PO_4$) solution, e.g., while leaving the functionality of the p-doped GaN region substantially unchanged. However, other materials would also be expected to provide the combination of attributes desired for a layer that protects p-doped GaN, for example low-temperature undoped GaN, InGaN, and aluminum oxide would be expected to perform as well as AlN.

Figure 10:
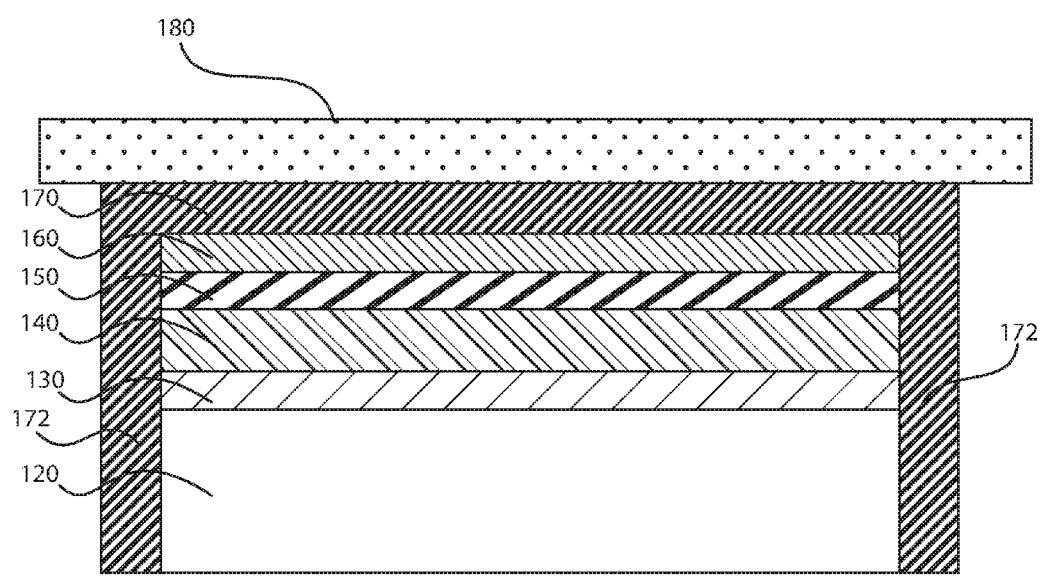
FIG. 10 is a cross sectional view of an alternative embodiment of semiconductor device in accordance with present principles at a stage comparable to what is shown in FIG. 4, in which the stressor layer is provided with self-pinning stressor layer sides.

Referring to FIG. 10, an alternative embodiment to fabrication is shown at a stage comparable to what is shown in FIG. 4. Here, the stressor layer 170 is provided with stressor layer sides 172 that extend vertically, e.g., down the sides of the stack, from the stressor layer 170 to the substrate 120. Stressor layer 170 and sides 172 may be of a unitary construction. The sides, which may be referred to as self-pinning stressor layer portions 172, may inhibit unintentional spalling, thereby insuring that spalling takes place at the time it is desired to conduct spalling. The stressor layer 170 and self-pinning stressor layer portions 172 may be formed as described above.

Prior to spalling the self-pinning stressor layers 172 can be released from the stressor layer by conducting a chemical etch with an etching agent such as, for example, nitric acid ($HNO_3$), sulfuric acid ($H_2SO_4$), hydrochloric acid (HCl) or other acids and mixtures thereof. In another embodiment, the releasing of the self-pinning stressor layer portions 172 of the stressor layer 170 from the stressor layer portion may be effected using grinding or polishing. Release, e.g., separation, may also be effected with lasers, e.g., Q-switched diode pumped solid state lasers. Release may take place at a release point, e.g., where the stressor layer 170 and the self-pinning stressor layers 172 come together. The stressor layer 170 and the self-pinning stressor layers 172 may be removed from the stack after spalling as described above.

Figure 11:
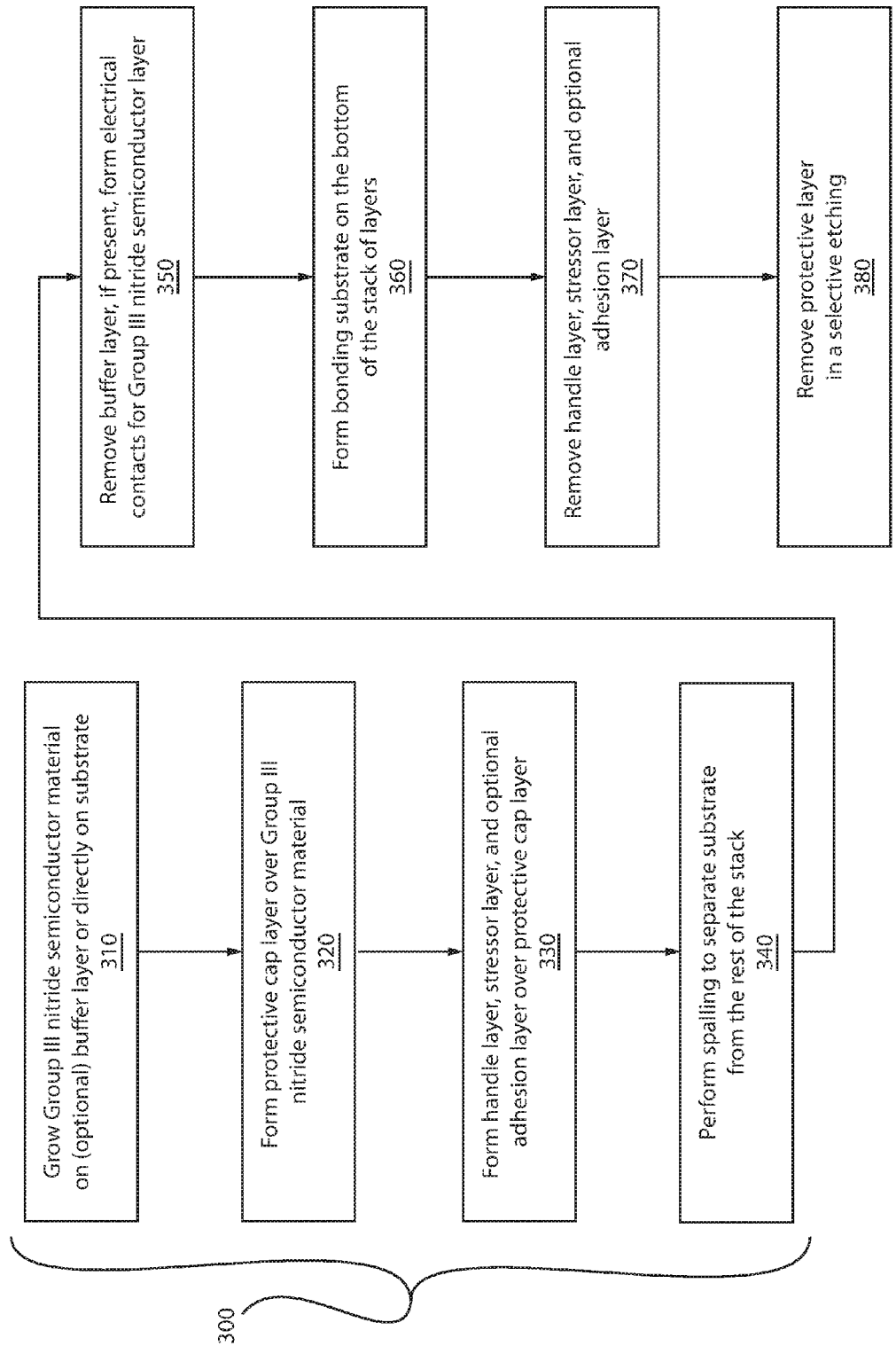
FIG. 11 is a block/flow diagram depicting the formation of a semiconductor device structure in accordance with an embodiment of the present principles.

Referring to FIG. 11, depicted is a block flow diagram 300 that shows the flow of providing a spalled semiconductor device with undamaged Group III nitride layer in accordance with an embodiment of the present principles.

In block 310, a Group III nitride semiconductor material is grown on a substrate (or optional buffer layer). The Group III nitride semiconductor may be a material mentioned above. The substrate material may be a material as noted above. In one embodiment, the material is a GaN material. In another embodiment, the semiconductor material is configured as an n-doped GaN material, a multiple quantum well (MQW) region, and a p-doped GaN material. The semiconductor material is formed as described above. In one embodiment, a buffer layer is formed over the substrate, and the semiconductor layer is grown over the buffer layer. Buffer layer materials and formation are as described above.

In block 320, a protective cap layer is formed over the Group III nitride semiconductor material. The protective cap layer may be formed in situ or ex situ, in the manners described above. The protective cap layer may be formed of AlN, or another material could be removed without damaging the underlying semiconductor material.

In block 330, layers that facilitate a later-performed spalling operation are formed over the protective cap layer. The layers include an optional adhesion layer, a stressor layer, and a handle layer. Materials and preparation methods for these layers are described above.

In block 340, spalling is performed to separate the substrate from the other layers of the stack, e.g., the handle layer, the stressor layer, the (optional) adhesion layer, the Group III nitride semiconductor layer, and the (optional) buffer layer. Spalling may be effected as described above.

In block 350, the optional buffer layer, if present, is removed as described above. Electrical contacts for the Group III nitride semiconductor layer are formed in operative contact with the Group III nitride semiconductor layer.

In block 360, a bonding substrate is formed on the stack, e.g., on the bottom side of the electrical contacts.

In block 370, the layers above the protective cap layer, e.g., the handle layer, the stressor layer, and the optional adhesion layer, are removed from the stack, in the manner described above.

In block 380, the protective layer is removed in a selective etching process that removes the protective cap layer and does not harm the underlying Group III nitride semiconductor layer.

Having described embodiments according to present principles, it should be apparent that certain advantages are realized. First of all, in performing spalling operations on semiconductor stack materials, there may be one or more spalling-facilitating layers that are added to the stack, some of which may harm and adversely affect the performance of (unprotected) Group III nitride semiconductor materials. In accordance with the embodiments of the present principles that are described herein, the Group III nitride semiconductor materials are protected by a protective cap layer, which provides a barrier to the potentially harmful effects of forming the spalling-facilitating layers and prevents damage to the underlying Group III nitride semiconductor materials.

This is particularly the case with gallium nitride semiconductor material, and particularly with p-doped gallium nitride semiconductor material. Forming the protective cap layer allows for the formation of spalling-facilitating layers, such as, for example, a metal adhesion layer, such as a Ti adhesion layer. Such adhesion layers may be formed over the protective cap layer by sputtering. A Ti adhesion layer applied by sputtering is desirable since it provides for good adhesion between the upper stressor layer and the protective cap layer, which improves the separation of the stack by spalling. Yet in the absence of the protective layer, forming a Ti adhesion layer by sputtering could damage the p-doped GaN material. Thus, including the protective cap layer in the stack over the p-doped GaN material may insure that an effective spalling operation is conducted while protecting the p-doped GaN region from being damaged. Further, the protective cap layer is removed from the stack with relative ease at the appropriate time after spalling, leaving behind undamaged semiconductor material.

It should be noted that the embodiments described in accordance with the present principles may provide a relatively low-cost solution to insuring that the semiconductor material is not damaged by spalling and the steps taken to prepare for spalling.

Having described according to the present principles a protective capping layer for spalled gallium nitride and methods for forming same (which description is intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of producing a semiconductor device comprising:
    forming a stack including a semiconductor material comprising:
        a Group III nitride semiconductor material formed on a growth substrate,
        a protective layer formed over the Group III nitride semiconductor material, and
        a handle layer and a stressor layer formed over the protective layer;
    spalling the stack to separate the growth substrate from the stack; and
    forming electrical contacts on a side of the Group III nitride semiconductor material.

2. The method of claim 1, further comprising vertically extending portions of the stressor layer along the sides of the stack that extend to the growth substrate.

3. The method of claim 1, further comprising forming an adhesion layer between the protective layer and the stressor layer, the adhesion layer comprising a metal material that is applied to the protective layer by sputtering.

4. The method of claim 3, wherein the adhesion layer includes a metal material selected from the group consisting of titanium, tungsten, chromium, nickel and combinations thereof.

5. The method of claim 1, wherein the Group III nitride material includes an n-doped region, a multiple quantum well region, and a p-doped region, the protective layer being formed directly on top of the p-doped region.

6. The method of claim 1, wherein the Group III nitride material includes an n-doped gallium nitride region, a multiple quantum well region including gallium nitride and indium-gallium nitride, and a p-doped gallium nitride region, the protective layer being formed directly on top of the p-doped gallium nitride region.

7. The method of claim 6, wherein the protective layer includes a material selected from the group consisting of aluminum nitride, gallium nitride, silicon nitride, and aluminum oxide.

8. The method of claim 7, further comprising forming an adhesion layer between the protective layer and the stressor layer, the adhesion layer comprising a metal material that is applied to the protective layer by sputtering.

9. The method of claim 8, wherein the adhesion layer includes a metal material selected from the group consisting of titanium, tungsten, chromium, nickel and combinations thereof.

10. The method of claim 8, wherein the adhesion layer includes Ti.

11. The method of claim 1, further comprising forming a buffer layer between the growth substrate and the Group III nitride semiconductor material; and removing the buffer layer before forming the electrical contacts on the side of the group III nitride semiconductor material.

12. A method of producing a semiconductor arrangement comprising:
    forming a stack including a semiconductor material comprising:
        a growth substrate,
        a buffer layer formed over the growth substrate,
        a Group III nitride semiconductor material formed over the buffer layer,
        a protective layer formed over the Group III nitride semiconductor material,
        a metal adhesion layer sputter-deposited over the protective layer,
        a stressor layer formed over the metal adhesion layer, and
        a handle layer formed over the stressor layer;
    spalling the stack to separate the growth substrate from the stack;
    removing the buffer layer to expose a side of the Group III nitride semiconductor material; and
    forming electrical contacts on the exposed side of the Group III nitride semiconductor material.

13. The method of claim 12, further comprising vertically extending portions of the stressor layer along the sides of the stack that extend to the growth substrate.

14. The method of claim 12, wherein the Group III nitride material includes an n-doped region, a multiple quantum well region, and a p-doped region, the protective layer being formed directly on top of the p-doped region.

15. The method of claim 12, wherein the Group III nitride material includes an n-doped gallium nitride region, a multiple quantum well region including gallium nitride and indium-gallium nitride, and a p-doped gallium nitride region, the protective layer being formed directly on top of the p-doped gallium nitride region.

16. The method of claim 12, wherein the protective layer includes a material selected from the group consisting of aluminum nitride, gallium nitride, silicon nitride and aluminum oxide.

17. The method of claim 12, wherein the metal adhesion layer includes a metal material selected from the group consisting of titanium, tungsten, chromium, nickel and combinations thereof.

18. The method of claim 17, wherein the protective layer includes a material selected from the group consisting of aluminum nitride, gallium nitride, silicon nitride and aluminum oxide.

19. The method of claim 18, wherein the metal adhesion layer includes a metal material selected from the group consisting of titanium, tungsten, chromium, nickel and combinations thereof.

20. A semiconductor stack comprising:
   a Group III nitride semiconductor material disposed between a substrate and a protective layer forming a barrier over the Group III nitride semiconductor material;
   a stressor layer formed over the protective layer; and
   a handle layer formed over the stressor layer.

* * * * *